United States Patent [19]
Larson et al.

[11] Patent Number: 5,360,747
[45] Date of Patent: Nov. 1, 1994

[54] METHOD OF REDUCING DICE TESTING WITH ON-CHIP IDENTIFICATION

[75] Inventors: Sheldon O. Larson, San Jose; Ronald J. Mack, Gilroy, both of Calif.

[73] Assignee: Xilinx, Inc., San Jose, Calif.

[21] Appl. No.: 74,897

[22] Filed: Jun. 10, 1993

[51] Int. Cl.$^5$ .................. H01L 21/66; G01R 31/26
[52] U.S. Cl. ................. 437/8; 148/DIG. 162; 365/201
[58] Field of Search ........... 437/8; 324/158 R, 158 T; 365/201–204; 364/580, 552, 551.01; 371/21.1; 148/162

[56] References Cited

U.S. PATENT DOCUMENTS 4,703,436  10/1987  Varshney .......................... 437/8
5,256,578  10/1993  Corley et al. ...................... 437/8

*Primary Examiner*—Olik Chaudhuri
*Assistant Examiner*—H. Jey Tsai
*Attorney, Agent, or Firm*—Jeanette S. Harms

[57] ABSTRACT

A method is provided which includes on-chip identification of individual die. The first wafer sort includes the steps of programming a plurality of dice on a wafer, programming predetermined memory memory cells on each good die to identify the wafer on which that die is located, and storing the location of each good die in a file created for each wafer. Then, the plurality of dice are subjected to predetermined conditions. In the second wafer sort, predetermined memory cells on one die are accessed to determine the associated file of that die. The associated file is then loaded. Finally, the good dice are tested. In another embodiment, the first wafer sort includes identifying the first good die on the wafer. After the next good die on the wafer is found, that die is programmed to indicate the location of the proceeding good die. This programming step is repeated until the last good die on the wafer is programmed. Once again, the wafer is subjected to adverse conditions. During the second wafer sort, the last good die on the wafer is identified and tested. Then, the next die location indicated by the tested die is tested. These steps of indicating the next die and testing that die are repeated until the first good die is tested. The present invention significantly reduces valuable test time by an amount directly related to the initial yield. Moreover, the present invention reduces wear and tear on the test equipment itself, thereby increasing the longevity of this expensive piece of equipment.

13 Claims, 10 Drawing Sheets

FILE 2

X AND Y COORDINATES OF DIE 200
X AND Y COORDINATES OF DIE 201
X AND Y COORDINATES OF DIE 202
...
X AND Y COORDINATES OF DIE 216
X AND Y COORDINATES OF DIE 217
X AND Y COORDINATES OF DIE 219
...
X AND Y COORDINATES OF DIE 299

FILE 1

X AND Y COORDINATES OF DIE 100
...
X AND Y COORDINATES OF DIE 199

FILE 3

X AND Y COORDINATES OF DIE 300
...
X AND Y COORDINATES OF DIE 382
X AND Y COORDINATES OF DIE 384
...
X AND Y COORDINATES OF DIE 399

FIG. 3

KEY TO

KEY TO

FIG. 6

METHOD OF REDUCING DICE TESTING WITH ON-CHIP IDENTIFICATION

BACKGROUND OF THE INVENTION

1. Field of the Invention

This invention relates to testing of dice on a wafer, and in particular to reducing the testing of dice with on-chip identification of good dice.

2. Description of the Related Art

Wafer sorting is a well-known process performed after wafer fabrication. During wafer sorting, each die on the wafer is electrically tested for electrical performance and circuit functioning. Thus, wafer sorting provides information on the effectiveness of the wafer fabrication process in producing working dice (i.e. chips) and provides identification of working dice which will be used in a subsequent packaging process.

FIGS. 1A and 1B show a typical wafer sort process including testing of all dice during a second sort. As is well-known to those in the art, each die typically includes a plurality of memory cells, in this example electrically programmable read only memory (EPROM) cells. An EPROM cell includes a source and a drain region separated by a channel region. A floating gate is formed over the channel region, while a control gate is formed over the floating gate. Referring to FIGS. 1A and 1B, all memory cells on a die are programmed in step 11 by varying the charge on the floating gate, thereby changing the threshold voltage required to allow a current to flow between the source and drain regions.

In step 12, the programming of the memory cells on the die is verified with a probe to ensure all memory cells exhibit an appropriate threshold voltage. If any of the memory cells on the die fail to exhibit the appropriate threshold voltage, then a number in a counter increments to indicate that a programming attempt has occured. This number in the counter is compared to a predetermined, maximum number of attempts set by the tester. If the number in the counter is less than or equal to the predetermined maximum number, all the memory cells on the die are reprogrammed. For simplicity, this comparing and reprogramming is included in verification step 12. Step 12 is typically repeated until either all the memory cells are satisfactorily programmed, or until the predetermined maximum number of attempts has been exceeded. At this time, if the die is "good" (i.e. all the memory cells exhibit the appropriate threshold voltage) as determined in step 13, the die is electronically inked. Electronic inking is a well-known method in the art in which one or more memory cells on the die are programmed to indicate a particular testing pattern for the probe in the second wafer sort (described below). If the die is "bad" (as determined in step 13) or after the probe programs and verifies the electronic inking of the die (as performed in step 14), the probe determines in step 15 if that die is the last die on the wafer. If that die is not the last die, the probe proceeds to the next die in step 16. However, if that die is the last die, then the probe proceeds in step 18 to the next wafer (if identified in step 17). Steps 11–18 constitute the first wafer sort 10.

After first wafer sort 10 is completed, the wafers are placed under predetermined, adverse conditions 20 to accelerate charge loss, thereby simulating memory use over, for example, a twenty year period. Typically, these predetermined, adverse conditions include baking the wafers as shown in step 21.

Second wafer sort 30 begins in step 31 by reading a first die for electronic ink. If the die is electronically inked, as determined in step 32, the probe tests the memory cells on the die in step 33 to determine the degree of charge loss. If the charge loss of a particular die exceeds a predetermined level as determined in step 34, that die is physically inked in step 37 (indicating the die is rejected for packaging). If, on the other hand, the charge loss is less than or equal to that predetermined level (i.e. the die is "good" and is ready to be used in the subsequent packaging process), then the probe determines if another die is present in step 35. If another die is present, the probe proceeds to the next die in step 36. Steps 31–37 are repeated until the last die on the wafer is found. Then, the probe moves to the next wafer in step 39 (if determined to be present in step 38). Otherwise, the probe stops in step 40.

This conventional method includes unnecessary testing time because all dice, whether or not successfully programmed in first wafer sort 10 (i.e. determined to be good or bad) are read for electronic ink in second wafer sort 30. Therefore, a need arises for a method of reducing the test time of dice on a wafer.

SUMMARY OF THE INVENTION

In accordance with the present invention, a method of testing dice includes on-chip identification of individual dice. This on-chip identification significantly reduces wafer test time by an amount directly related to the initial yield. Moreover, the present invention reduces wear and tear on the test probe itself, thereby increasing the longevity of this expensive piece of equipment.

A first wafer sort in accordance with the present invention includes the steps of programing a plurality of dice on a wafer, programming predetermined memory cells on each die to identify the wafer on which the die is located and storing the location of each good die in a file created for the wafer on which the good die is located. Then, the plurality of dice are subjected to predetermined conditions. During the second wafer sort, the predetermined memory cells on one die are accessed to determine the associated file of that die. That associated file is then loaded. Finally, the good dice on that wafer are tested.

After the step of testing, the probe moves to the next wafer, if present, and accesses the predetermined memory cells of one die on that wafer. Once again, the associated file is loaded and then the good dice are tested.

In another embodiment of the present invention, the first wafer sort includes the steps of identifying a first good die on the wafer, proceeding to the next good die on the wafer, programming the next good die to indicate the location of the preceding good die, and repeating this programming until a last good die on the wafer is programmed. Once again, the wafer is subjected to predetermined conditions. During the second wafer sort, the last good die is identified and tested. Then, the probe proceeds to the next die location indicated by the tested die. The die at the new location is then tested. The steps of proceeding to the next location indicated on-chip and the subsequent testing of that die are repeated until the first good die is tested.

BRIEF DESCRIPTION OF THE DRAWINGS

FIG. 3 illustrates three files containing information regarding the wafers shown in FIG. 2.

FIG. 6 shows a partial schematic of a wafer having illustrative dice, wherein each good die, other than the first good die, indicate the location of another good die on the wafer.

DETAILED DESCRIPTION OF THE DRAWINGS

Figure 1A:
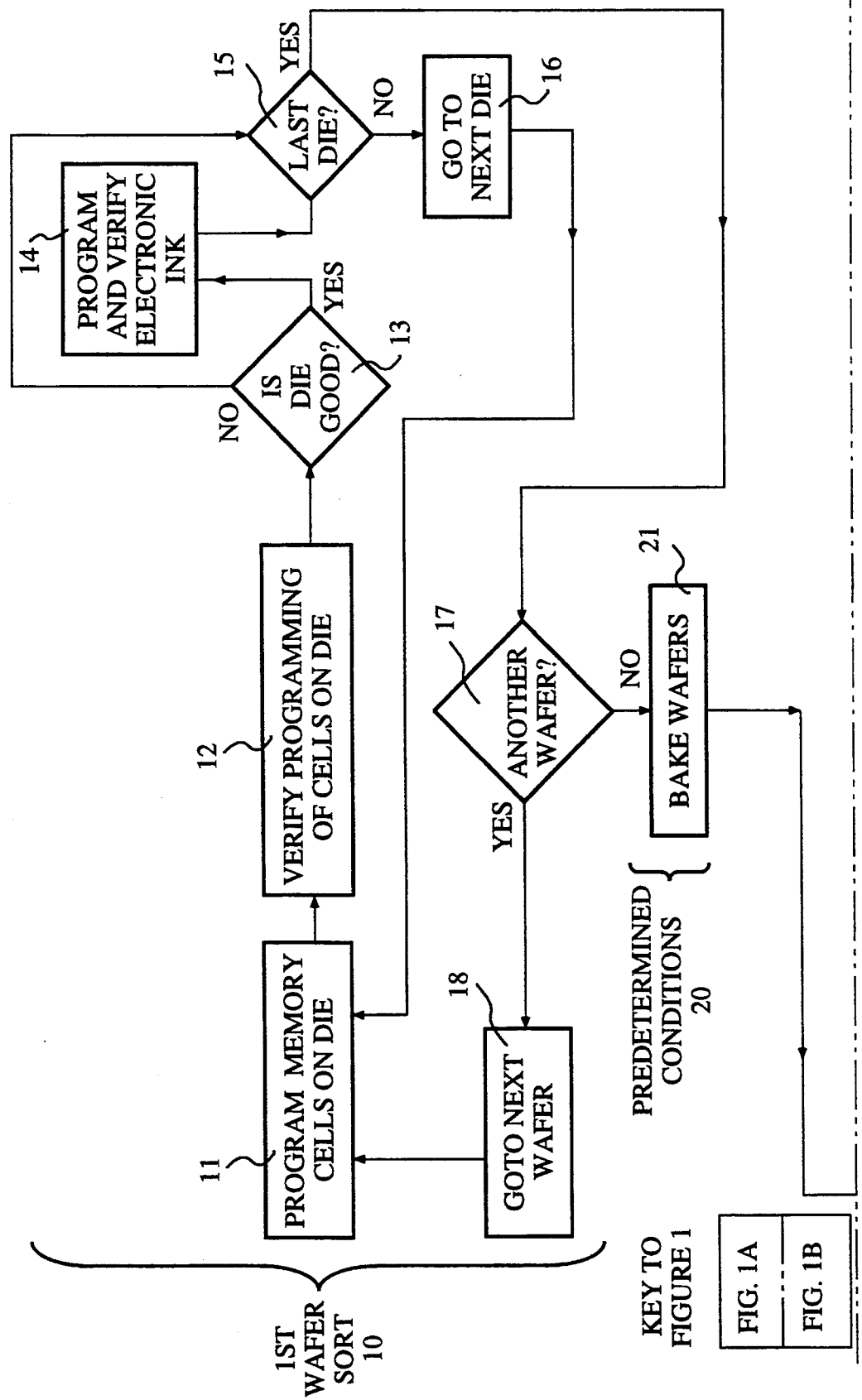
FIGS. 1A and 1B show a typical wafer sort process including testing of all dice during the second sort.
Figure 1B:
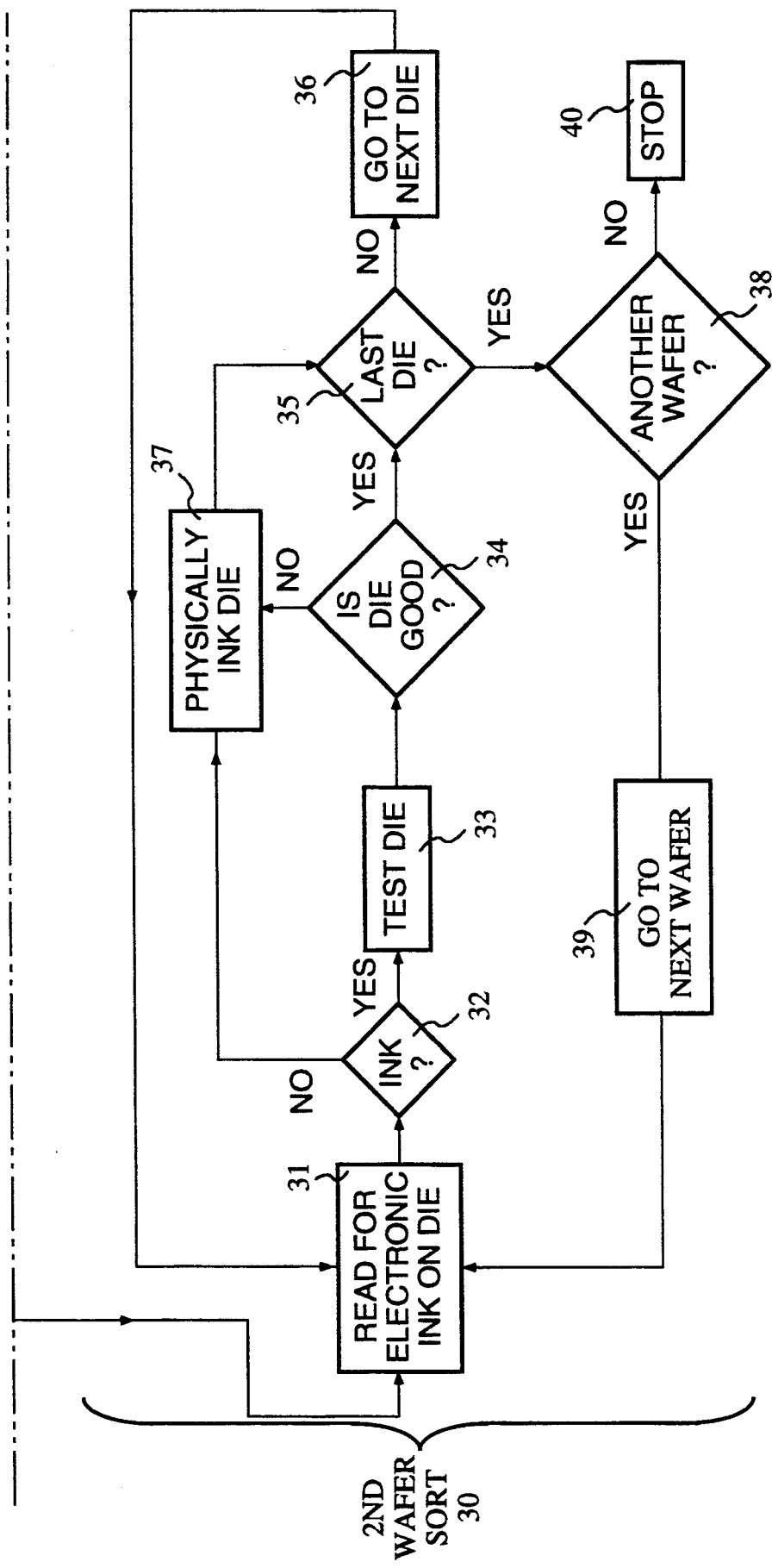
Figure 4:
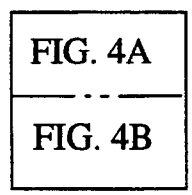
FIGS. 4A and 4B show a process for testing dice in accordance with the present invention.
Figure 4A:
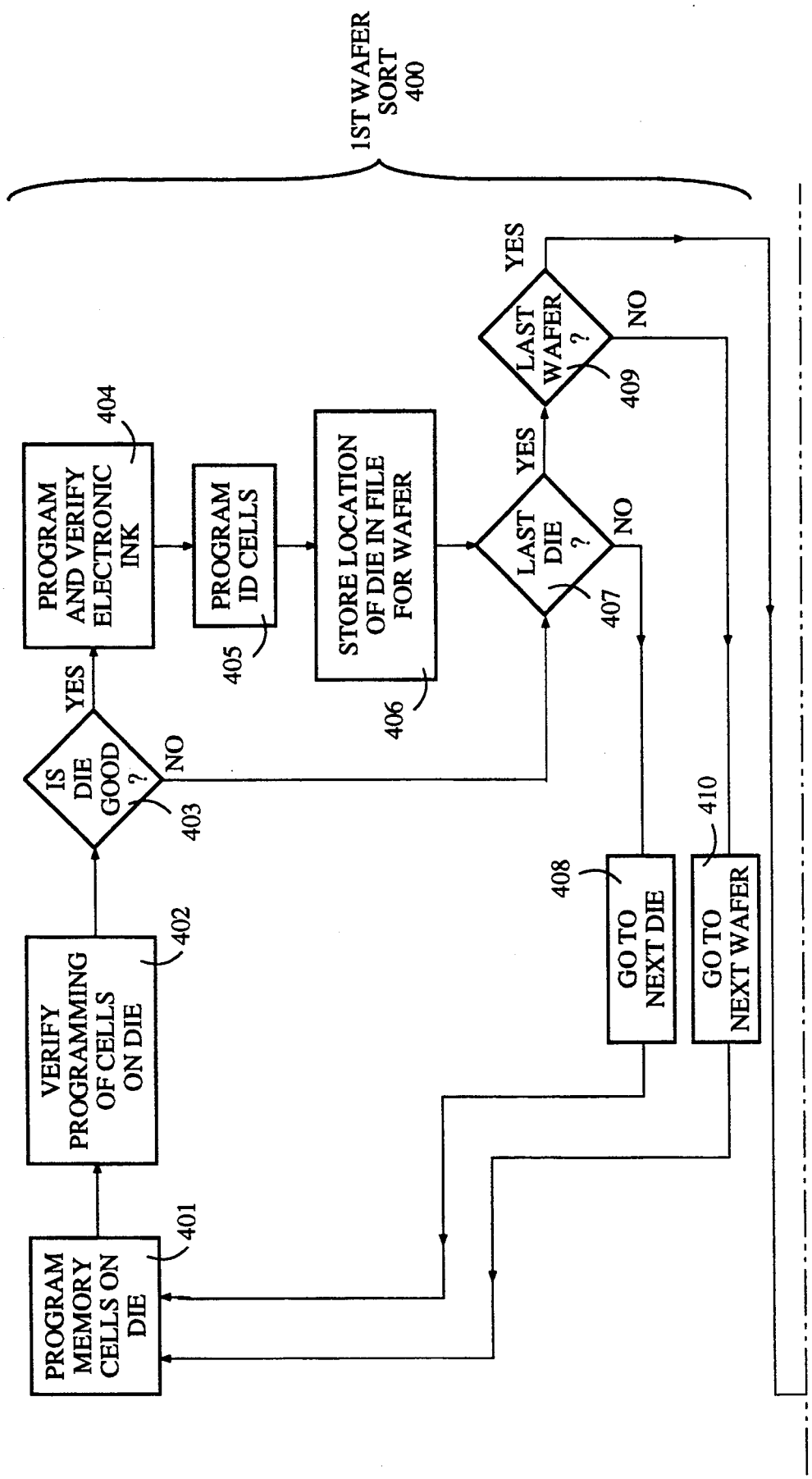

Referring to FIG. 4A which illustrates the steps included in first wafer sort 400, the memory cells on a die are programmed in step 401. Verification of this programming is performed using conventional methods (see, for example, step 12 in FIG. 1A) in step 402. If the die is good (i.e. all the memory cells exhibit the appropriate threshold voltage) as determined in step 403, the die is electronically inked in step 404.

Figure 2:
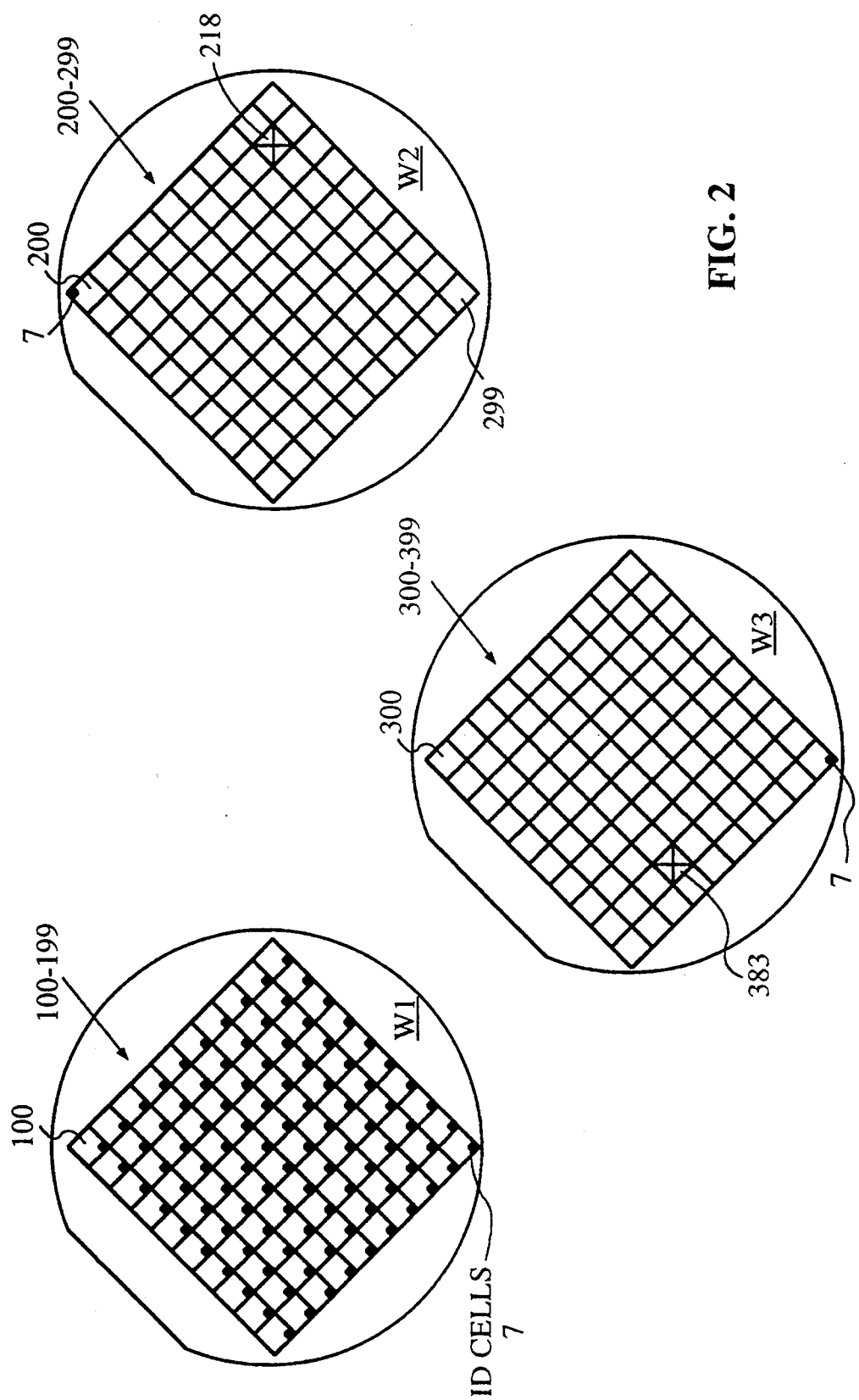
FIGS. 2A, 2B and 2C show illustrative wafers having identification memory cells in accordance with the present invention.

Then, in accordance with the present invention, predetermined memory cells on each good die, hereinafter the identification (ID) cells 7, are programmed in step 405 to identify a file associated with a particular wafer. FIG. 2 shows three wafers W1, W2, and W3 each having 100 dice. Specifically, wafer W1 has dice 100–199, wafer W2 has dice 200–299, and wafer W3 has dice 300–399. ID cells 7 on die 100, for example, identify a file (described in detail in reference to FIG. 3) associated with wafer W1, whereas ID cells 7 on die 399, for example, identify a file associated with wafer W3. Note that all good dice on wafers W2 or W3 have programmed ID cells 7, although only one die having programmed ID cells 7 is illustrated for each wafer.

The location of each good die on the wafer is then stored in a file for that wafer in step 406. If the die is not the last die on the wafer as determined in step 407, the probe proceeds to the next die in step 408. Steps 401–407 are then repeated. If the die is the last die on the wafer, the probe moves in step 410 to the next wafer (as determined in step 409). If no other wafers are present, first wafer sort 400 is complete.

Thus, in accordance with one embodiment of the present invention, a file is created for each wafer during step 406 in first wafer sort 400. For example and referring to FIG. 3, files 1, 2, and 3 contain information to identify the "good" dice (i.e. each memory cell on the die having a predetermined threshold voltage) on wafers W1, W2, and W3, respectively. Specifically, these files contain the locations, i.e. typically X and Y coordinates, of the good dice as determined in step 403. For illustration purposes, die 218 (FIG. 2) of wafer W2 is shown as having failed to attain a satisfactory threshold voltage (note the cross in the die), and therefore is not listed in file 2 (FIG. 3). Likewise, die 383 (FIG. 2) of wafer W3 is also shown as having failed to attain a satisfactory threshold voltage, and therefore is not listed in file 3 (FIG. 3).

Figure 4B:
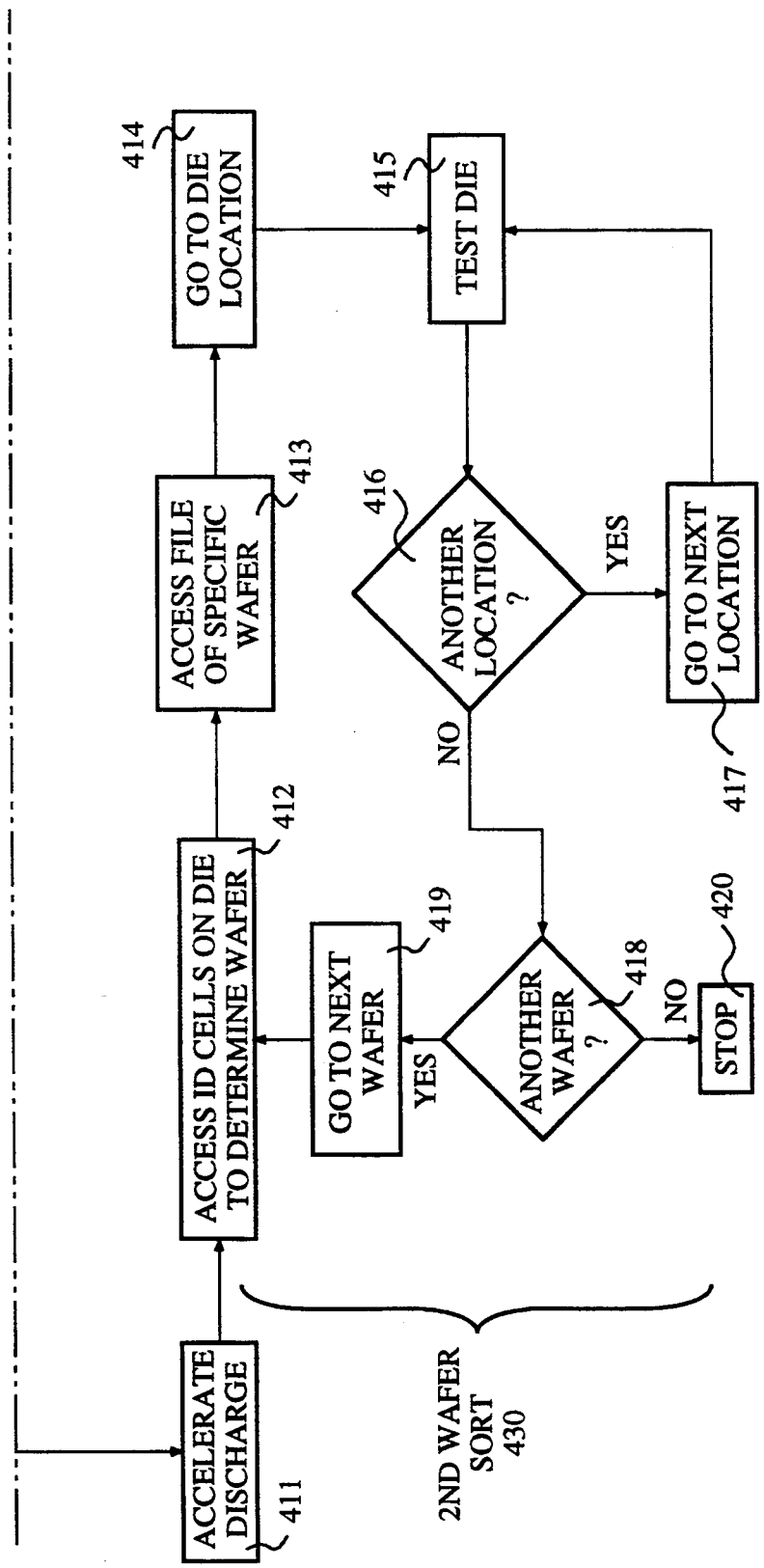

Referring back to FIG. 4B, during step 411, all wafers are subjected to predetermined, adverse conditions to accelerate discharge of the memory cells on the wafers. Then, in step 412 of second wafer sort 430, the probe reads the ID cells of the first electronically inked die on the wafer. For example, the probe examines the ID cells 7 (FIG. 2) on die 200 (the first electronically inked die) to access the file associated with the particular wafer on which die 200 is located, i.e. wafer W2. The file associated with wafer W2, i.e. file 2, is accessed in step 413. The probe, after reading the first location in the file, proceeds directly to the first "good" die (as determined in first wafer sort 400) on the wafer in step 414. Note that the first good die in this example is, in fact, die 200. Die 200 is then tested in step 415. If die 200 fails this test, the die is rejected, whereas if die 200 passes the test, the die is acceptable for the packaging process.

After the probe tests the die in step 415, if there is another die location in the file (thereby indicating another good die to retest), as determined in step 416, the probe moves to that next location in step 417. Steps 415-417 are repeated until the file contains no other locations for dice. Then, the probe either proceeds to the next wafer, if present (determined in step 418), in step 419 (then repeating steps 412–418) or stops its examination in step 420.

Note that in this embodiment, step 404 of electronically inking all the good dice on the wafer serves as a back-up in case the files created in step 404 are corrupted. Thus, in other embodiments of the present invention, step 406 is not performed.

In a typical wafer fabrication, 30 to 50% yield is not uncommon. As explained in detail above in reference to FIGS. 2, 3, 4A and 4B, the present invention substantially eliminates testing of the bad dice (i.e. those dice that fail the programming verification in the first wafer sort 400) during the second wafer sort 430. Therefore, the present invention significantly reduces valuable test time during second wafer sort 430 by an amount directly related to the initial yield. For example, if the initial yield is 50% during the first wafer sort, test time during the second wafer sort is typically reduced by approximately 50%. If the initial yield is 30% during the first wafer sort, test time during second wafer sort 430 is reduced by approximately 60%. Moreover, the present invention reduces wear and tear on the probe itself, thereby increasing the longevity of this expensive piece of equipment.

Figure 5:
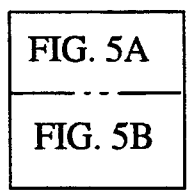
FIGS. 5A and 5B illustrate another embodiment of a process for testing dice in accordance with the present invention.
Figure 5A:
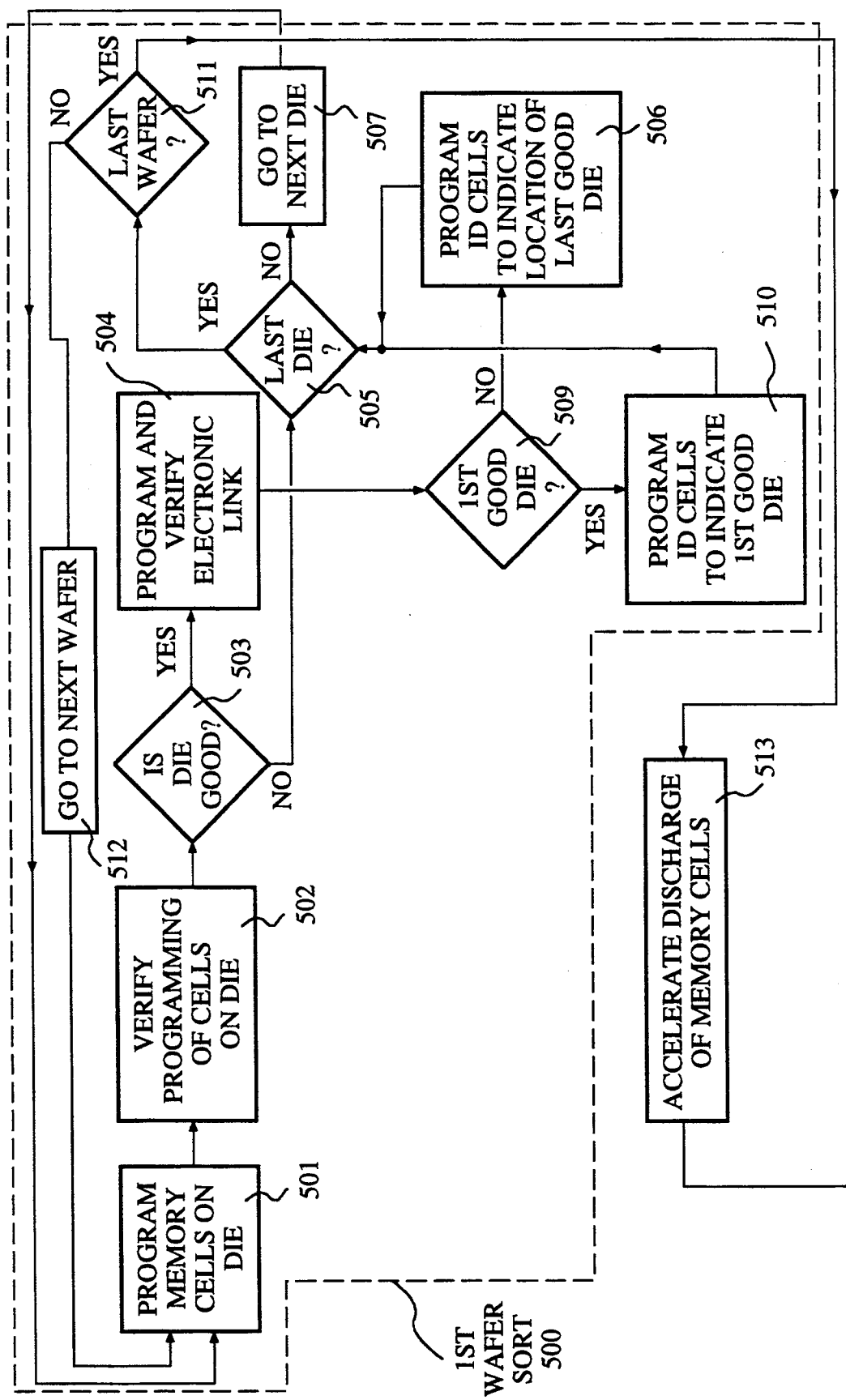
Figure 5B:
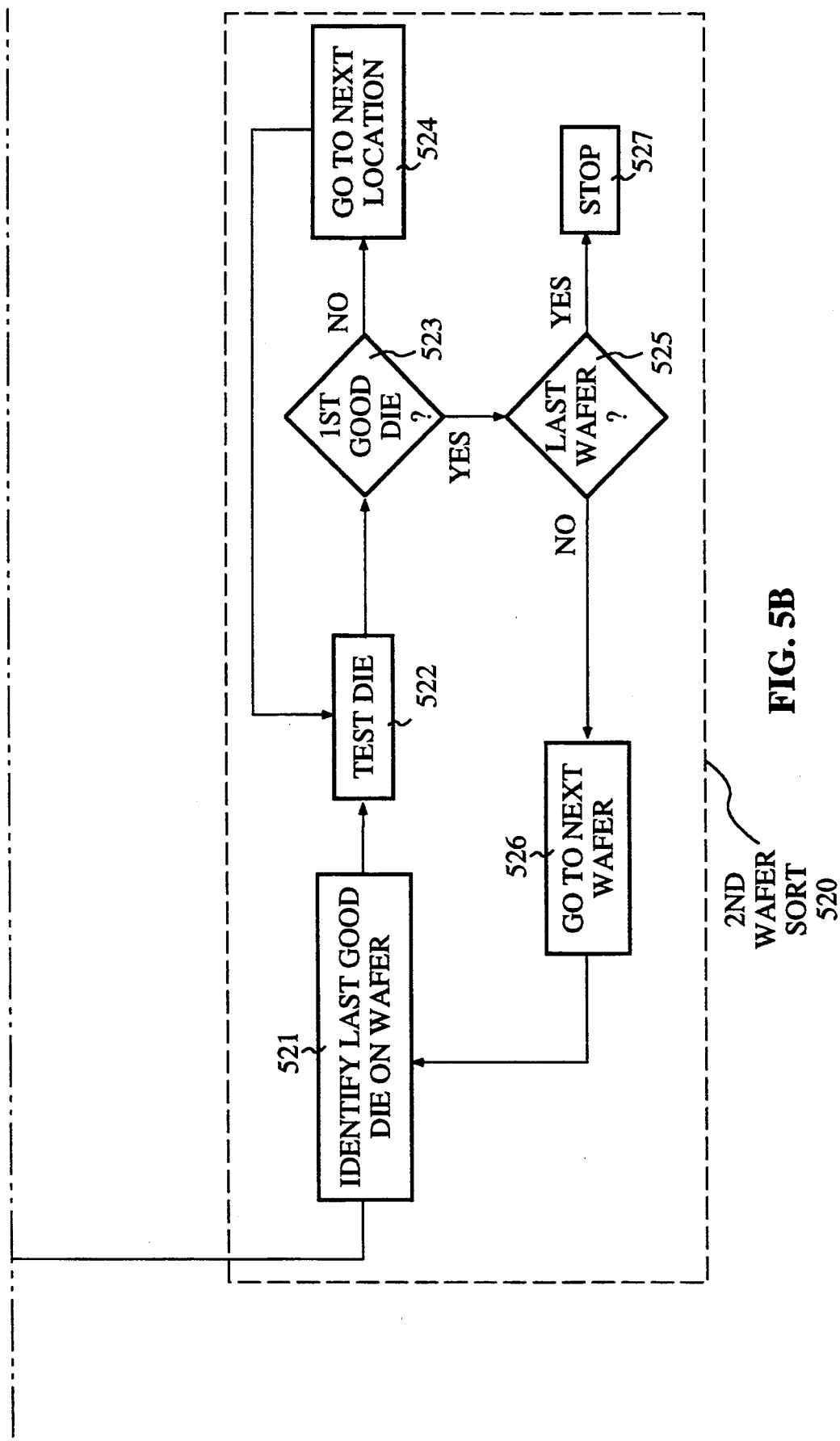

Another embodiment of the present invention is shown in FIGS. 5A and 5B. Referring to FIG. 5A, all memory cells on a die are programmed in step 501. This programming is verified in a conventional manner in step 502. If any memory cells on the die fail to exhibit the appropriate threshold voltage, i.e. the die is bad, as determined in step 503, the probe determines in step 505 whether that die is the last die on the wafer.

In accordance with the present invention, if the memory cells on the die exhibit the appropriate threshold voltage in step 503, i.e. the die is good, the probe electronically inks the die in step 504, then determines if that die is the first good die on the wafer in step 509. If that die is the first good die, the ID cells on the die are programmed in step 510 to indicate a "first good die" designation. For example, referring to FIG. 6 which illustrates a sample wafer having die 600–607, the ID cells 7A on die 600 are programmed to identify die 600 as the "first good die".

Figure 6:
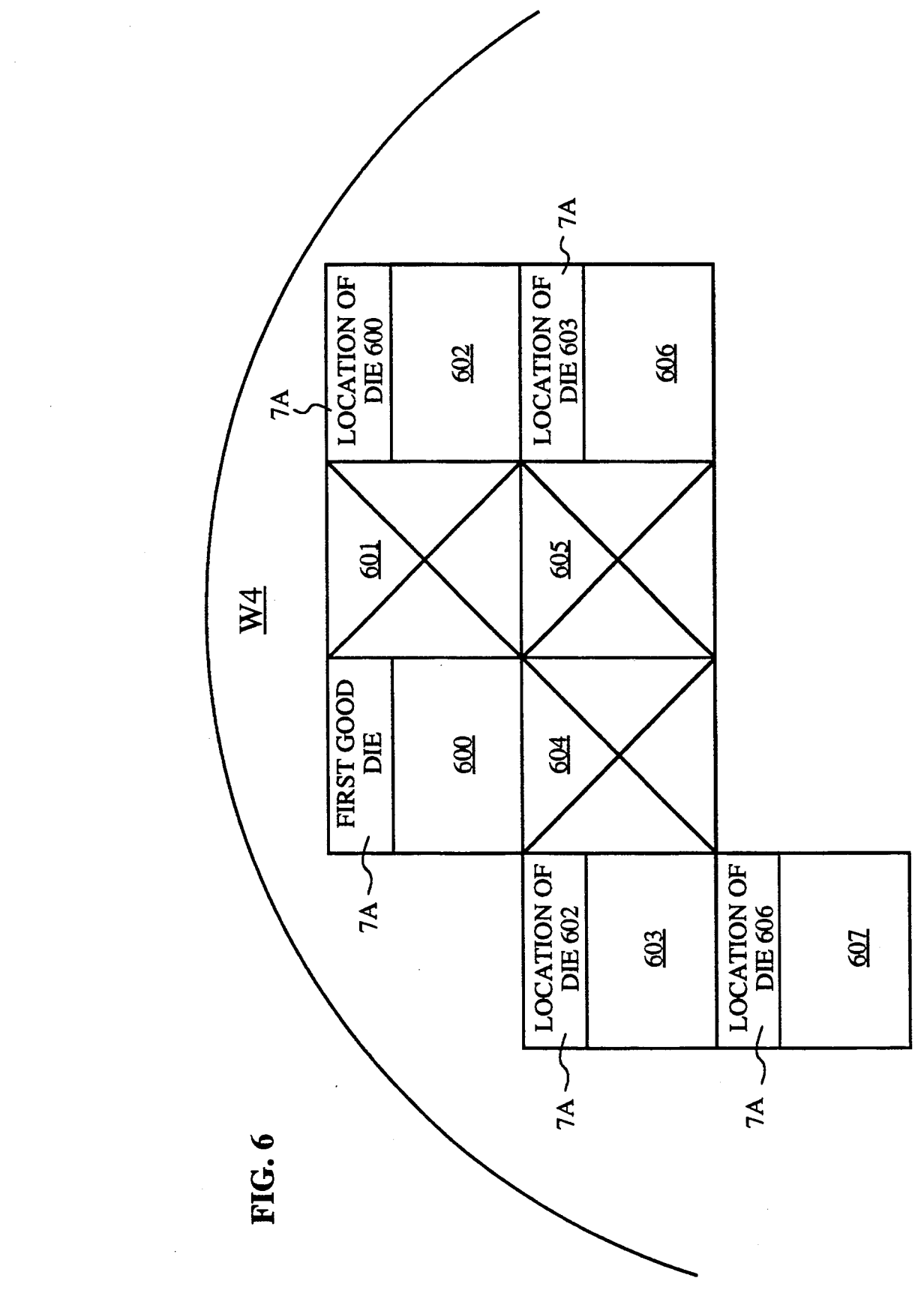

In further accordance with the present invention, if a die is not the first good die as determined in step 509, then ID cells 7A are programmed in step 506 to indicate the location (typically the X and Y coordinates on a wafer map) of the last good die. Thus, as shown in FIG. 6, because die 601 is bad, ID cells 7A on die 602 are programmed to identify the location of die 600 (the last good die). In a similar manner, the ID cells 7A on dice 603 and 606 identify the locations of dice 602 and 603, respectively.

If the die is not the last die as determined in step 505, the probe proceeds in step 507 to the next die to repeat the programming process. If that die, for example die 607 on wafer W4 shown in FIG. 6, is the last die, then the probe proceeds in step 512 (FIG. 5) to the next wafer (if present as determined in step 511). If no other wafers are present, first wafer sort 500 is complete and all wafers are placed under the previously described adverse conditions in step 513 to accelerate discharge of the memory cells.

FIG. 5B illustrates the steps to perform second wafer sort 520. In step 521, the probe identifies the last good die (typically by the above-described electronic inking process). For example, die 607 on wafer W4 (FIG. 6) is identified, then tested in step 522. If the ID cells 7A on die 607 do not designate the tested die as the "first good" die, the probe proceeds to the location indicated by the ID cells 7A. Thus, referring to FIG. 6, the probe moves from die 607 to the location of die 606 as indicated by the ID cells 7A on die 607. Steps 522–525 are repeated until the "first good" die has been tested. Therefore, the die on wafer W4 are tested in the following order: die 607, die 606, die 603, die 602, and die 601. Note that the probe follows a testing pattern in second wafer sort 520 opposite to the search pattern followed in first wafer sort 500. In this manner, the step of creating the file (for example, in the embodiment shown in FIG. 4) is unnecessary.

After testing of the "first good" die, i.e. die 600, the probe moves to the next wafer in step 526 (if present as determined in step 525). Steps 521–526 are repeated until no wafers remain to be tested. After the last wafer is tested, the probe stops in step 527.

The above description is meant to be illustrative only and not limiting. For example, the present invention is applicable to the testing of any type of memory cells on a die. Thus, the present invention includes the testing of electrically erasable programmable read only memory (EEPROM) cells and flash EPROM cells. Other embodiments of the present invention will be apparent to those skilled in the art in light of the description and the appended claims.

We claim:

1. A method of testing dice on at least one wafer comprising the steps of:
   programming a plurality of dice;
   programming identification memory cells on each good die to identify the wafer on which said good die is located;
   storing the location of each good die in a file;
   subjecting said plurality of dice to discharge conditions;
   accessing the identification memory cells on one die to determine the file associated with said die;
   loading said associated file; and
   testing only said good dice.

2. The method of testing of claim 1 wherein said step of storing includes creating a file for each wafer.

3. The method of testing of claim 2 wherein said locations include X and Y conditions on the wafer on which said die is located.

4. The method of testing of claim 2 wherein said step of subjecting said plurality of dice to discharge conditions includes baking said plurality of dice.

5. The method of testing of claim 2 further including a step of electronically inking the good dice one each wafer preceding said step of subjecting said plurality of dice to discharge conditions.

6. The method of testing of claim 2 wherein said one die is electronically inked.

7. A method of testing dice on a wafer comprising the steps of:
   (a) identifying a first good die on said wafer;
   (b) proceeding to the next good die on said wafer;
   (c) programming said next good die to indicate a location of the preceding good die;
   (d) repeating steps (b) and (c) until a last good die on said wafer is programmed;
   (e) subjecting said wafer to discharge conditions;
   (f) identifying said last good die;
   (g) testing said last good die, thereby generating a tested die;
   (h) proceeding to a preceding die location indicated by said tested die;
   (i) testing the die at said preceding die location, thereby generating another tested die;
   (k) repeating steps (h) and (i) until said first good die is tested.

8. The method of testing of claim 7 wherein steps (a) and (c) include programming identification memory cells on said first good die and said next good die, respectively.

9. The method of testing of claim 8 wherein said location includes X and Y coordinates on said wafer.

10. The method of testing of claim 7 wherein step (e) includes baking said dice on said wafer.

11. The method of testing of claim 7 wherein step (i) includes accessing identification memory cells of said die at said preceding die location.

12. The method of testing of claim 7 wherein step (d) includes electronically inking said last good die.

13. A method of storing a plurality of wafers, each wafer having a plurality of dice thereon, said method comprising the steps of:
   (a) programming a plurality of memory cells on each die;
   (b) verifying said programming of said plurality of memory cells;
   (c) providing a location of an identified good die by programming a plurality of identification memory cells on another good die;
   (d) subjecting said plurality of memory cells to discharge conditions; and
   (e) testing only the good dice.

* * * * *

UNITED STATES PATENT AND TRADEMARK OFFICE
CERTIFICATE OF CORRECTION

PATENT NO. : 5,360,747

DATED : November 1, 1994

INVENTOR(S) : Sheldon O. Larson and Ronald J. Mack

It is certified that error appears in the above-identified patent and that said Letters Patent is hereby corrected as shown below:

Claim 1, col. 5, line 61, "file;" should read --file associated with the wafer on which said good die is located;--.

Claim 3, col. 6, line 8, "conditions" should read --coordinates--.

Signed and Sealed this

Nineteenth Day of September, 1995

Attest:

BRUCE LEHMAN

*Attesting Officer*   *Commissioner of Patents and Trademarks*